(12) United States Patent
Hu et al.

(10) Patent No.: US 10,164,044 B2
(45) Date of Patent: Dec. 25, 2018

(54) GATE STACKS

(71) Applicant: Micron Technology, Inc., Boise, ID (US)

(72) Inventors: Yushi Hu, Boise, ID (US); John Mark Meldrim, Boise, ID (US); Eric Blomiley, Boise, ID (US); Everett Allen McTeer, Eagle, ID (US); Matthew J. King, Boise, ID (US)

(73) Assignee: Micron Technology, Inc., Boise, ID (US)

(*) Notice: Subject to any disclaimer, the term of this patent is extended or adjusted under 35 U.S.C. 154(b) by 314 days.

(21) Appl. No.: 14/688,387

(22) Filed: Apr. 16, 2015

(65) Prior Publication Data
US 2016/0308018 A1 Oct. 20, 2016

(51) Int. Cl.
| | | |
|---|---|---|
| H01L 29/49 | (2006.01) | |
| H01L 21/28 | (2006.01) | |
| H01L 29/66 | (2006.01) | |
| H01L 29/78 | (2006.01) | |
| H01L 29/06 | (2006.01) | |

(52) U.S. Cl.
CPC .... *H01L 29/4933* (2013.01); *H01L 21/28061* (2013.01); *H01L 21/28097* (2013.01); *H01L 29/4975* (2013.01); *H01L 29/0649* (2013.01); *H01L 29/66477* (2013.01); *H01L 29/78* (2013.01)

(58) Field of Classification Search
CPC ............ H01L 21/28044–21/28061; H01L 21/28035–21/28097; H01L 29/4966–29/4975
See application file for complete search history.

(56) References Cited

U.S. PATENT DOCUMENTS

| | | | | |
|---|---|---|---|---|
| 5,208,179 A | * | 5/1993 | Okazawa | H01L 21/76202 257/316 |
| 5,231,046 A | * | 7/1993 | Tasaka | H01L 21/31116 148/DIG. 50 |
| 5,561,078 A | * | 10/1996 | Tasaka | H01L 21/28123 148/DIG. 50 |
| 6,069,055 A | * | 5/2000 | Ukeda | H01L 21/76232 257/E21.548 |
| 6,103,607 A | * | 8/2000 | Kizilayalli | C23C 14/0617 257/E21.203 |
| 6,339,246 B1 | * | 1/2002 | Kizilyalli | C23C 14/0641 257/410 |
| 6,773,975 B1 | * | 8/2004 | Ramkumar | H01L 21/76229 257/E21.548 |
| 6,774,442 B2 | * | 8/2004 | Hayashi | H01L 21/28061 257/412 |

(Continued)

*Primary Examiner* — Eric Ward
(74) *Attorney, Agent, or Firm* — Schwegman Lundberg & Woessner, P.A.

(57) ABSTRACT

Some embodiments disclose a gate stack having a gate (e.g., polysilicon (poly) material) horizontally between shallow trench isolations (STIs), a tungsten silicide (WSix) material over the gate and the STIs, and a tungsten silicon nitride (WSiN) material on a top surface of the WSix material. Some embodiments disclose a gate stack having a gate between STIs, a first WSix material over the gate and the STIs, a WSiN interlayer material on a top surface of the first WSix material, and a second WSix material on a top surface of the WSiN interlayer material. Additional embodiments are disclosed.

32 Claims, 3 Drawing Sheets

(56) References Cited

U.S. PATENT DOCUMENTS

| | | | |
|---|---|---|---|
| 7,781,333 B2* | 8/2010 | Sung | H01L 21/28061 |
| | | | 257/751 |
| 2001/0046765 A1* | 11/2001 | Cappellani | H01L 21/26513 |
| | | | 438/627 |
| 2002/0072209 A1* | 6/2002 | Tseng | H01L 29/4941 |
| | | | 438/592 |
| 2004/0207030 A1* | 10/2004 | McTeer | H01L 21/28061 |
| | | | 257/412 |
| 2008/0061386 A1* | 3/2008 | Taguwa | H01L 21/28052 |
| | | | 257/412 |

* cited by examiner

GATE STACKS

BACKGROUND

Gate stacks including a tungsten silicide (WSix) material tier with topography may suffer from WSix cracking, which may affect gate functional reliability.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DESCRIPTION OF THE EMBODIMENTS

The following detailed description refers to the accompanying drawings which show, by way of illustration, specific aspects and embodiments in which the present subject matter may be practiced. These embodiments are described in sufficient detail to enable those skilled in the art to practice the present subject matter.

The term "horizontal" as used in this application is defined as a plane parallel to the conventional plane or surface of a wafer, such as a substrate, regardless of the actual orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the actual orientation of the wafer or substrate.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the present invention is defined only by the appended claims, along with the full scope of equivalents to which such claims are entitled.

Figure 1A:
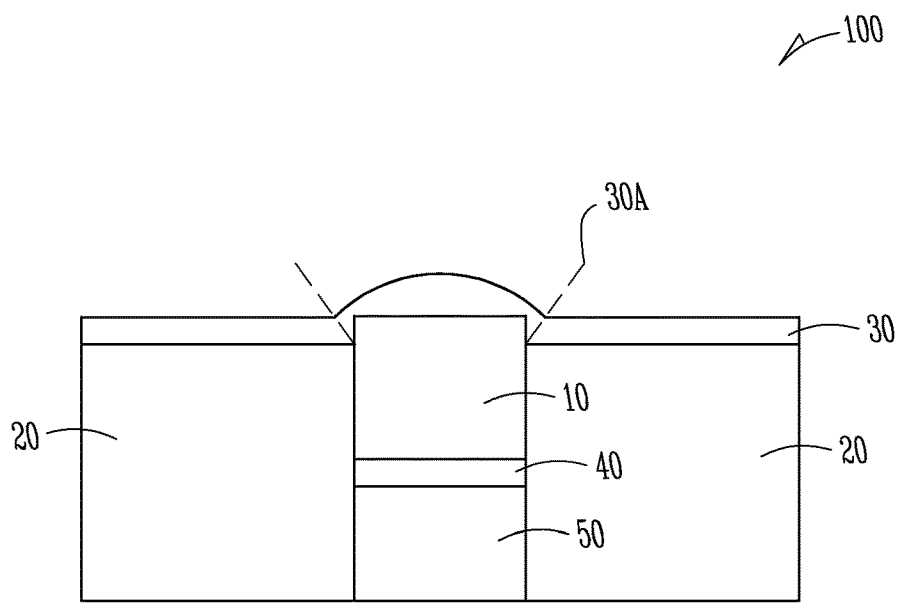
FIG. 1A is a cross-sectional view illustrating an example of a gate stack according to a first embodiment.

FIG. 1A is a cross-sectional view illustrating an example of a gate stack 100 according to a first embodiment. The gate stack 100 may include an NAND complementary metal-oxide semiconductor (CMOS) gate. In some embodiments, the gate stack 100 may include a gate 10 formed horizontally between shallow trench isolations (STIs) 20 (e.g., silicon oxide), and a WSix material 30 formed over the gate 10 and the STIs 20. In many situations, the height of the gate 10 is generally different from the height of the STIs 20. As shown in FIG. 1A, for example, the gate 10 is higher than the STIs 20, and thus a top surface of the gate 10 and top surfaces of the STIs 20 are not on a same level. In some embodiments, the gate 10 may include a polysilicon (poly) material. Weak spots 30A may be formed at low material density regions as deposited due to topography, and may cause integration issues within the gate stack 100. In some embodiments, the gate stack 100 may further include a gate oxide 40 (e.g., silicon oxide), which is formed vertically between the gate 10 and a channel 50. The channel 50 may include a single crystalline silicon active area.

Figure 1B:
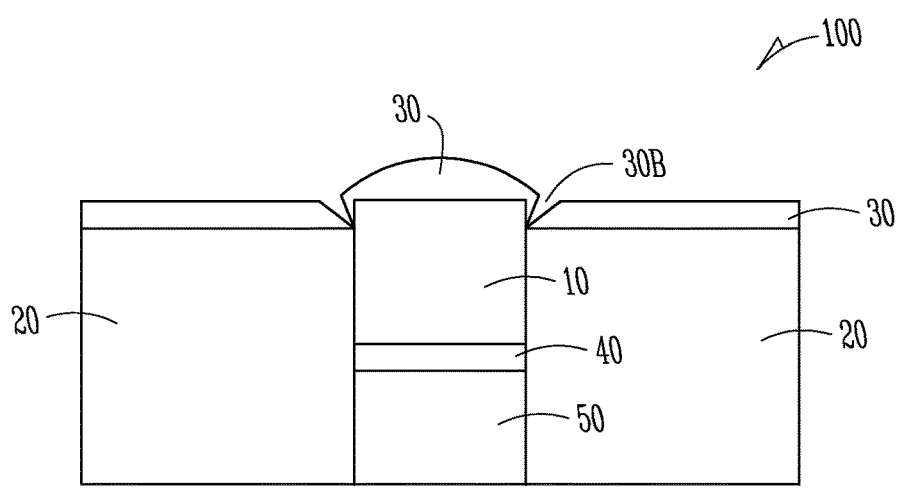
FIG. 1B is a cross-sectional view illustrating a cracked gate stack according to the first embodiment.

FIG. 1B is a cross-sectional view illustrating a cracked gate stack 100 according to the first embodiment. Over some processing steps during a fabrication of the gate stack 100 with topography, WSix grains may grow, and may thus introduce volume shrinkage and large tensile stress, which may cause some open cracks 30B at low density areas (such as weak spots 30A as shown in FIG. 1A). For example, during the fabrication of the gate stack 100, after receiving a thermal treatment with a thermal budget, cracks 30B may be formed at the weak spots 30A of the WSix material 30. Such cracks 30B may result in broken gate reliability, and thus may yield concerns to the gate stack 100.

Figure 2:
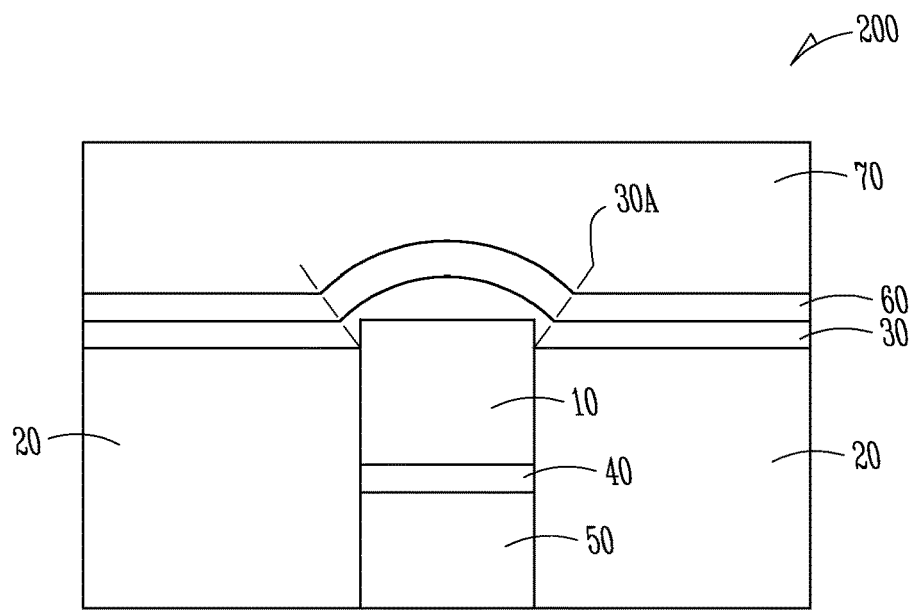
FIG. 2 is a cross-sectional view illustrating an example of a gate stack according to a second embodiment.

FIG. 2 is a cross-sectional view illustrating an example of a gate stack 200 according to a second embodiment. In some embodiments, the gate stack 200 may include a gate 10 formed between STIs 20, a WSix material 30 formed on a top surface of the poly material 10 and top surfaces of the STIs 20, and a tungsten silicon nitride (WSiN) material 60 as a cap on a top surface of the WSix material 30. In some embodiments, the WSiN material 60 has a thickness in a range from 50 A to 200 A. Weak spots 30A (as shown in FIG. 1A) may be formed at low material density regions due to topography.

Compared with the WSix material 30, the WSiN material 60 may have a higher resistance to grain growth under a thermal treatment, may experience smaller volume shrinkage and stress build-up, and thus may be more stable than the WSix material 30 during the thermal treatment. The WSiN material 60 in the gate stack 200 may function as both a stress stabilization layer and a crack propagation barrier to limit the crack formation and propagation. Such a hybrid WSix/WSiN stack structure may mitigate possible WSix cracking of the WSix material deposited on the gate stack with topography. A crack-free gate stack may thus be achieved with such a hybrid WSix/WSiN stack.

In some embodiments, the gate stack 200 may further include a dielectric material (e.g., tetraethyl orthosilicate (TEOS)) 70 formed on a top surface of the WSiN material 60. In some embodiments, the gate stack 200 may further include a gate oxide 40 formed between the poly material 10 and a channel 50. The channel 50 may include a single crystalline silicon active area. The gate stack 200 may include a source and a drain (not shown in the figures). The gate stack 200 may be used in a peripheral transistor of a three dimension (3D) NAND flash memory or other memories such as a planar nonvolatile memory or a volatile memory.

Figure 3:
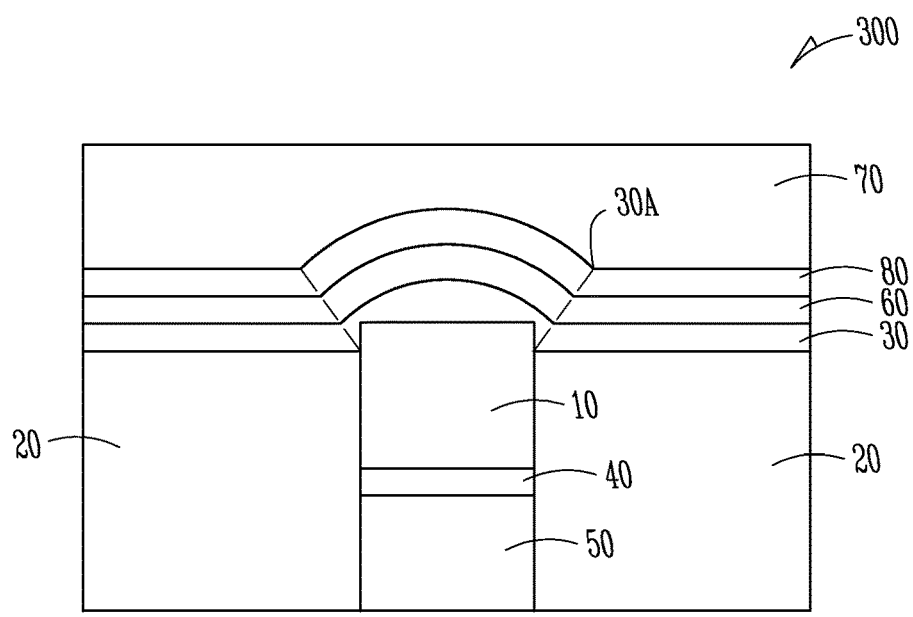
FIG. 3 is a cross-sectional view illustrating an example of a gate stack according to a third embodiment.

FIG. 3 is a cross-sectional view illustrating an example of a gate stack 300 according to a third embodiment.

In some embodiments, the gate stack 300 may include a gate 10 formed between STIs 20, a first WSix material 30 formed on a top surface of the gate 10 and top surfaces of the STIs 20, a WSiN interlayer material 60 on a top surface of the first WSix material 30, and a second WSix material 80 on a top surface of the WSiN interlayer material 60. In some embodiments, a thickness of the WSiN interlayer material 60 is approximately of 50 A to 200 A. Weak spots 30A may be formed at low material density regions as deposited due to topography.

Compared with a WSix material (such as the first WSix material 30 and the second WSix material 80), the WSiN interlayer material 60 may have a higher resistance to grain growth under a thermal treatment, may experience smaller volume shrinkage and stress build-up, and thus may be more stable than the WSix material during the thermal treatment. The WSiN interlayer material 60 in the gate stack 300 may function as both a stress stabilization layer and a crack propagation barrier to limit the crack formation and propagation. For example, even when cracks are formed in the first WSix material 30, the WSiN interlayer 60 may block the cracks to prevent the cracks from propagating through the whole stack. Therefore, such a hybrid WSix/WSiN/WSix stack structure may mitigate possible WSix cracking of the WSix material deposited on the gate stack with topography. A crack-free gate stack may thus be achieved with such a hybrid WSix/WSiN/WSix stack. The gate stack 300 may be used in a peripheral transistor of a 3D NAND flash memory or other memories such as a planar nonvolatile memory or a volatile memory.

In some embodiments, the gate stack 300 may further include a TEOS material 70 formed over the second WSix material 80. In some embodiments, the gate stack 300 may further include a gate oxide 40 formed between the poly material 10 and a channel 50. The gate stack 300 may include a source and a drain (not shown in the figures).

Figure 4:
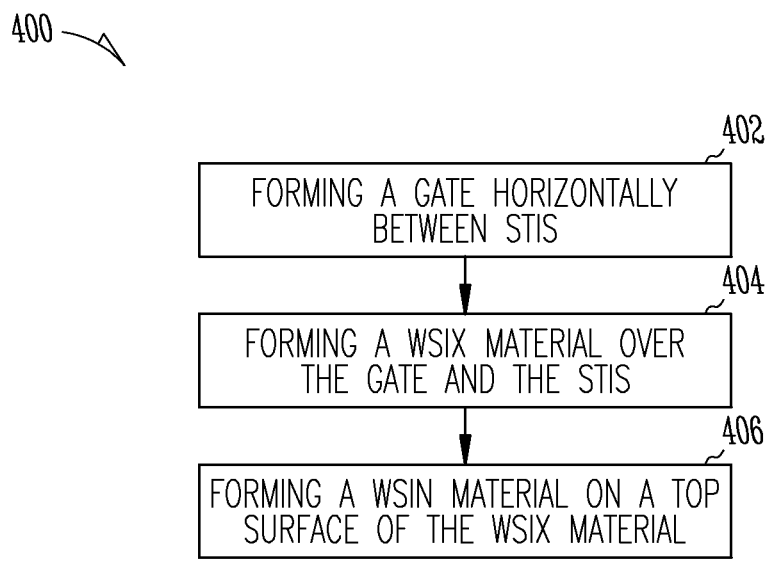
FIG. 4 is a process flow diagram illustrating a process of fabricating a gate stack according to an embodiment.

FIG. 4 is a process flow diagram illustrating a process 400 of fabricating a gate stack 200 as shown in FIG. 2 according to an embodiment.

At 402, a gate structure may be formed on a substrate (such as a silicon material). The gate structure may include a gate 10 (such as a poly material) horizontally between STIs 20 (e.g., silicon oxide) as shown in FIG. 2. In some embodiments, the gate structure may further include a gate oxide 40 formed vertically between the poly material 10 and a channel 50. The channel 50 may include a single crystalline silicon active area. The gate structure may include a source and a drain (not shown in the figures).

At 404, a WSix tier 30 may be formed over the gate 10 and the STIs 20. In some embodiments, in a Physical Vapor Deposition (PVD) chamber, WSix may be deposited on the top surface of the gate 10 and the top surfaces of the STIs 20 to form the WSix tier 30.

At 406, a WSiN tier 60 may be formed on a top surface of the WSix tier 30 as a cap. In some embodiments, in the chamber (e.g., the PVD chamber used to form the WSix tier 30), a WSix material may be sputtered on the top surface of the WSix tier 30, while adding nitrogen gas into the chamber, to incorporate nitrogen into the sputtered WSix material to form the WSiN tier 60. In some embodiments, in the chamber used to form the WSix tier 30, a WSiN material may be directly sputtered on the top surface of the WSix tier 30 to form the WSiN tier 60.

These methods of fabricating a gate stack are flexible, and the whole fabrication process can be done in the same PVD chamber for example. In this way, it can be easier to control the location and thickness of the WSix tier 30 and the WSiN tier 60 individually in the hybrid WSix/WSiN stack. Additionally, these methods of fabricating a gate stack are integration-friendly. The WSix tier 30 in the hybrid WSix/WSiN stack may act as an interface layer, and the WSiN tier 60 (with nitrogen up to e.g., 13%) may not provide any dry etch concerns due to the small amount of nitrogen.

In some embodiments, in an implant chamber, nitrogen may be implanted into an upper portion of the WSix tier 30 to transform the upper portion of the WSix material into a WSiN material to form the WSiN tier 60.

In some embodiments, a dielectric material (e.g., TEOS) tier 70 may be formed on a top surface of the WSiN tier 60.

Figure 5:
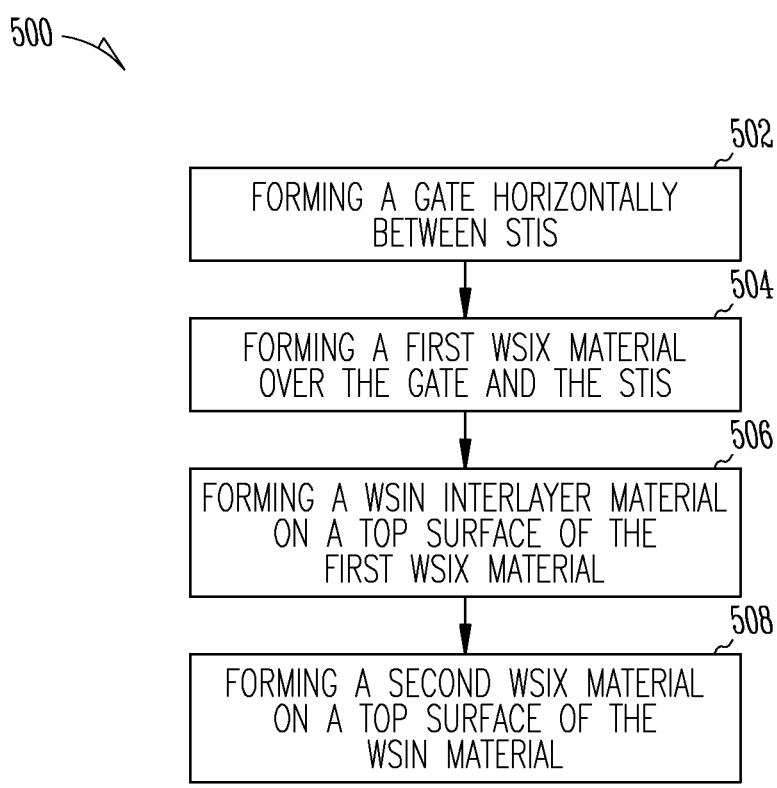
FIG. 5 is a process flow diagram illustrating a process of fabricating a gate stack according to another embodiment.

FIG. 5 is a process flow diagram illustrating a process 500 of fabricating a gate stack 300 according to another embodiment.

At 502, a gate structure may be formed on another material, such as a substrate. The gate structure may include a gate 10 (such as a poly material) horizontally between STIs 20 (e.g., silicon oxide) as shown in FIG. 3. In some embodiments, the gate structure may further include a gate oxide 40 formed vertically between the gate 10 and a channel 50. The channel 50 may include a single crystalline silicon active area.

At 504, a first WSix tier 30 may be formed over the gate 10 and the STIs 20. In some embodiments, in a chamber (e.g., a PVD chamber), WSix may be deposited on the top surface of the gate 10 and the top surfaces of the STIs 20 to form the first WSix tier 30.

At 506, a WSiN interlayer tier 60 may be formed on a top surface of the first WSix tier 30.

In some embodiments, in the PVD chamber used to form the first WSix tier 30, while adding nitrogen gas into the chamber, a WSix material may be sputtered on the top surface of the first WSix tier 30 to incorporate nitrogen into the sputtered WSix to form the WSiN interlayer tier 60. In some embodiments, in the PVD chamber used to form the first WSix tier 30, a WSiN material may be directly sputtered on the top surface of the first WSix tier 30 to form the WSiN interlayer tier 60. In some embodiments, in an implant chamber, nitrogen may be implanted into an upper portion of the first WSix tier 30 to transform the upper portion of the WSix material into a WSiN material to form the WSiN interlayer tier 60.

At 508, a second WSix tier 80 may be formed on a top surface of the WSiN interlayer tier 60. In some embodiments, in the same PVD chamber used to form the first WSix tier 30 and the WSiN interlayer tier 60, a WSix material may be directly deposited to form the second WSix tier 80 on the top surface of the WSiN interlayer tier 60.

In some embodiments, a dielectric material (e.g., TEOS) tier 70 may be formed over the second WSix tier 80.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of ordinary skill in the art upon reading and understanding the above description.

The invention claimed is:

1. A gate stack, comprising:
   a gate horizontally between shallow trench isolations (STIs) and directly contacting the STIs, a height of the gate being different from a height of the STIs;
   a tungsten silicide (WSix) material on a top surface of the gate and top surfaces of the STIs; and
   a tungsten silicon nitride (WSiN) material on a top surface of the WSix material.

2. The gate stack of claim 1, further comprising:
   a dielectric material over the WSiN material.

3. The gate stack of claim 2, wherein the dielectric material comprises tetraethyl orthosilicate (TEOS).

4. The gate stack of claim 1, further comprising:
   a channel under the gate.

5. The gate stack of claim 4, wherein the channel comprises silicon.

6. The gate stack of claim 4, further comprising:
a gate oxide between the gate and the channel.

7. The gate stack of claim 1, wherein the STIs comprise silicon oxide.

8. The gate stack of claim 1, wherein the gate comprises a polysilicon (poly) material.

9. A gate stack, comprising:
a gate horizontally between shallow trench isolations (STIs) and directly contacting the STIs, a height of the gate being different from a height of the STIs;
a first tungsten silicide (WSix) material on a top surface of the gate and top surfaces of the STIs;
a tungsten silicon nitride (WSiN) interlayer material on a top surface of the first WSix material; and
a second WSix material on a top surface of the WSiN interlayer material.

10. The gate stack of claim 9, further comprising:
a tetraethyl orthosilicate (TEOS) material over the second WSix material.

11. The gate stack of claim 9, further comprising:
a channel under the gate; and
a gate oxide between the gate and the channel.

12. A method of making a gate stack, comprising:
forming a gate horizontally between shallow trench isolations (STIs) and directly contacting the STIs, a height of the gate being different from a height of the STIs;
forming a tungsten silicide (WSix) material on a top surface of the gate and top surfaces of the STIs; and
forming a tungsten silicon nitride (WSiN) material on a top surface of the WSix material.

13. The method of claim 12, further comprising:
forming a dielectric material over the WSiN material.

14. The method of claim 12, wherein forming the WSix material comprises depositing, in a chamber, WSix on a top surface of the gate and top surfaces of the STIs.

15. The method of claim 14, wherein forming the WSiN material comprises sputtering WSix on the top surface of the WSix material in the chamber, while adding a nitrogen gas into the chamber, to incorporate nitrogen into the sputtered WSix to form the WSiN material.

16. The method of claim 14, wherein forming the WSiN material comprises adding nitrogen while forming an upper portion of the WSix material to incorporate nitrogen into the upper portion of the WSix material to form the WSiN material.

17. The method of claim 14, wherein forming the WSiN material comprises sputtering WSiN on the top surface of the WSix material in the chamber to form the WSiN material.

18. The method of claim 14, wherein the chamber comprises a physical vapor deposition (PVD) chamber.

19. The method of claim 14, wherein forming the WSiN material comprises depositing WSiN on the top surface of the WSix material in a Chemical Vapor Deposition (CVD) chamber.

20. The method of claim 14, wherein forming the WSiN material comprises implanting nitrogen into an upper portion of the WSix material in an implant chamber to transform the upper portion of the WSix material into the WSiN material.

21. A method of making a gate stack, comprising:
forming a gate horizontally between shallow trench isolations (STIs) and directly contacting the STIs, a height of the gate being different from a height of the STIs;
forming a first tungsten silicide (WSix) material on a top surface of the gate and top surfaces of the STIs;
forming a tungsten silicon nitride (WSiN) interlayer material on a top surface of the first WSix material; and
forming a second WSix material on a top surface of the WSiN interlayer material.

22. The method of claim 21, wherein forming the first WSix material comprises depositing, in a chamber, WSix on the top surface of the gate and the top surfaces of the STIs.

23. The method of claim 22, wherein forming the WSiN interlayer material comprises sputtering WSix on the top surface of the first WSix material in the chamber, while adding a nitrogen gas into the chamber, to incorporate nitrogen into the sputtered WSix to form the WSiN interlayer material.

24. The method of claim 22, wherein forming the WSiN interlayer material comprises implanting nitrogen into an upper portion of the first WSix material in an implant chamber to transform the upper portion of the first WSix material into the WSiN interlayer material.

25. The method of claim 22, wherein forming the WSiN interlayer material comprises sputtering WSiN on the top surface of the first WSix material in the chamber to form the WSiN interlayer material.

26. The method of claim 22, wherein forming the second WSix material comprises depositing, in the chamber, WSix on the top surface of the WSiN interlayer material.

27. A gate stack, comprising:
a gate between first and second dielectric materials and directly contacting the first and second dielectric materials, the gate including a height different from a height of each of the first and second dielectric materials;
a silicide material on a top surface of the gate and on top surfaces of the first and second dielectric materials; and
a combination of metal and silicon nitride material on a top surface of the silicide material.

28. The gate stack of claim 27, wherein the silicide material comprises tungsten silicide (WSix).

29. The gate stack of claim 28, wherein the combination of metal and silicon nitride comprises tungsten silicon nitride (WSiN).

30. The gate stack of claim 27, wherein the first and second dielectric materials comprise silicon oxide.

31. The gate stack of claim 27, further comprising a gate oxide under the gate and between the first and second dielectric materials and directly contacting the first and second dielectric materials.

32. The gate stack of claim 31, further comprising a channel under the gate oxide and between the first and second dielectric materials and directly contacting the first and second dielectric materials.

* * * * *